(12) United States Patent
Haba et al.

(10) Patent No.: US 9,972,582 B2
(45) Date of Patent: May 15, 2018

(54) WARPAGE BALANCING IN THIN PACKAGES

(71) Applicant: Invensas Corporation, San Jose, CA (US)

(72) Inventors: Belgacem Haba, Saratoga, CA (US); Sangil Lee, Santa Clara, CA (US); Craig Mitchell, San Jose, CA (US); Gabriel Z. Guevara, San Jose, CA (US); Javier A. Delacruz, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days. days.

(21) Appl. No.: 15/670,382

(22) Filed: Aug. 7, 2017

(65) Prior Publication Data

US 2018/0040572 A1    Feb. 8, 2018

Related U.S. Application Data

(60) Provisional application No. 62/372,147, filed on Aug. 8, 2016.

(51) Int. Cl.
| | |
|---|---|
| *H01L 23/488* | (2006.01) |
| *H01L 23/00* | (2006.01) |
| *H01L 21/48* | (2006.01) |
| *B23K 1/00* | (2006.01) |
| *H01L 23/498* | (2006.01) |

(52) U.S. Cl.
CPC ......... *H01L 23/562* (2013.01); *B23K 1/0008* (2013.01); *H01L 21/4853* (2013.01); *H01L 23/49816* (2013.01); *H01L 23/49838* (2013.01)

(58) Field of Classification Search
CPC ........... H01L 21/4853; H01L 23/49816; H01L 23/49838; H01L 23/562; B23K 1/0008
See application file for complete search history.

(56) References Cited

U.S. PATENT DOCUMENTS

| | | | |
|---|---|---|---|
| 6,673,649 | B1 | 1/2004 | Hiatt et al. |
| 2006/0255474 | A1 | 11/2006 | Ahmad et al. |
| 2008/0116574 | A1 | 5/2008 | Fan |
| 2010/0102433 | A1 | 4/2010 | Doan |
| 2016/0148892 | A1* | 5/2016 | Hu ........................ H01L 24/81 257/737 |

OTHER PUBLICATIONS

International Search Report and Written Opinion for PCT Application No. PCT/US2017/045711, dated Oct. 31, 2017, 12 pages.

* cited by examiner

*Primary Examiner* — Daniel Shook

(57) ABSTRACT

Representative implementations of devices and techniques provide reinforcement for a carrier or a package. A reinforcement layer is added to a surface of the carrier, often a bottom surface of the carrier that is generally under-utilized except for placement of terminal connections. The reinforcement layer adds structural support to the carrier or package, which can be very thin otherwise. In various embodiments, the addition of the reinforcement layer to the carrier or package reduces warpage of the carrier or package.

20 Claims, 11 Drawing Sheets

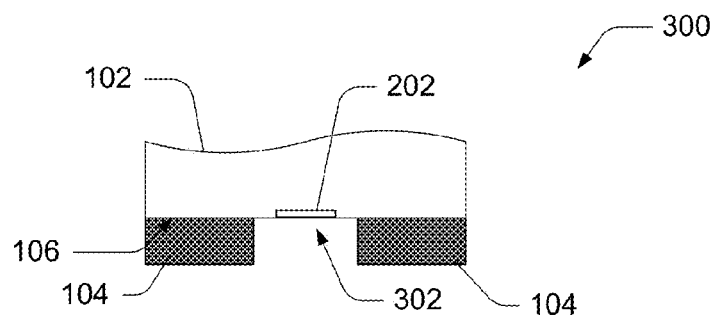
FIG. 3A
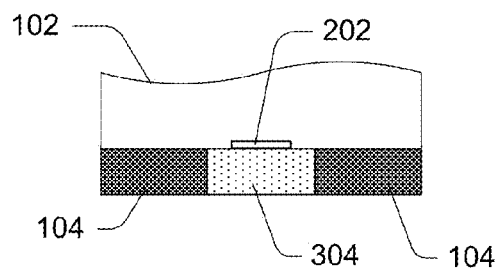
FIG. 3B
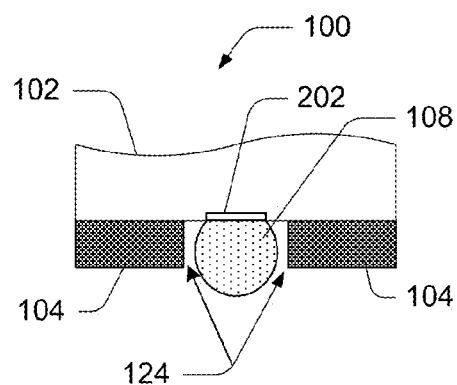
FIG. 3C

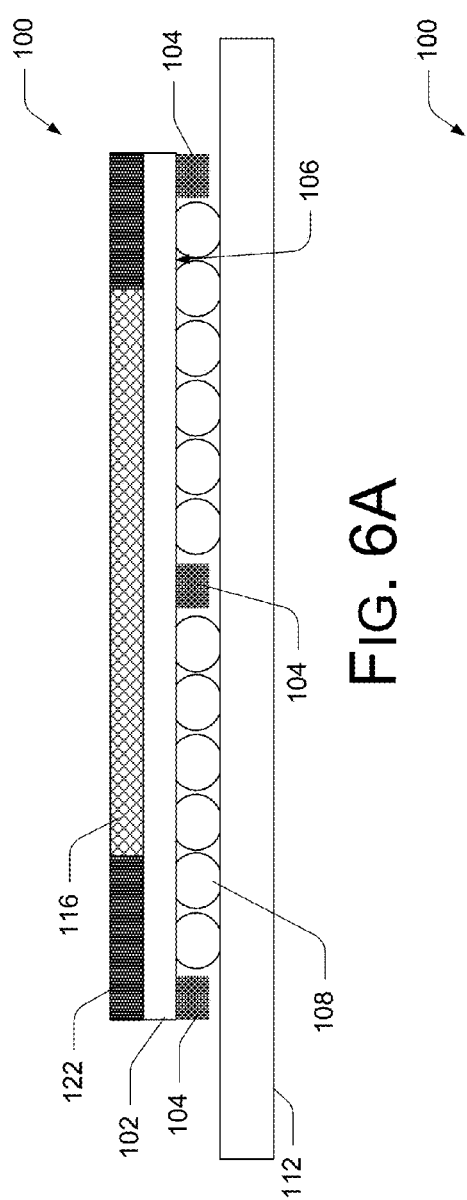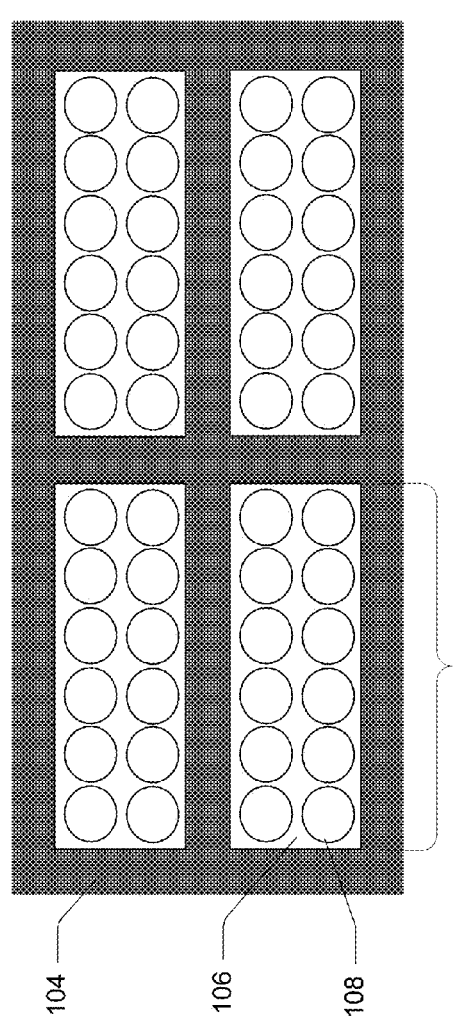

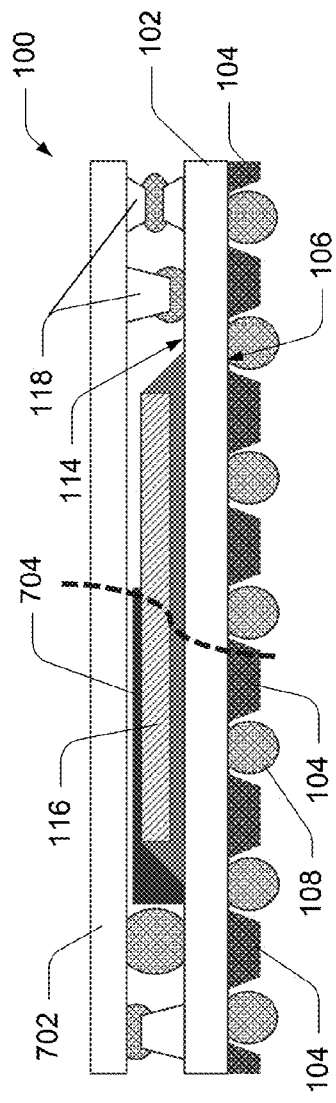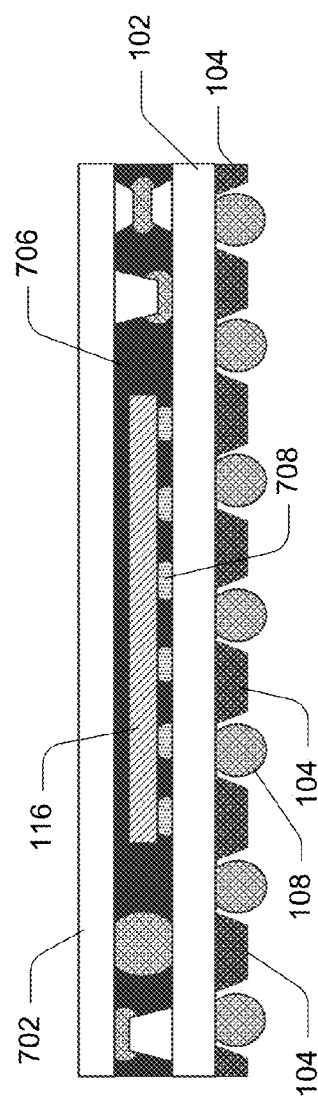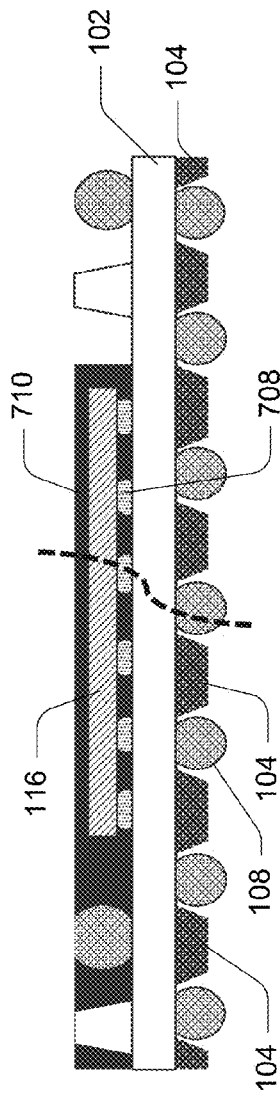

WARPAGE BALANCING IN THIN PACKAGES

PRIORITY CLAIM AND CROSS-REFERENCE TO RELATED APPLICATION

This application claims the benefit under 35 U.S.C. § 119(e)(1) of U.S. Provisional Application No. 62/372,147, filed Aug. 8, 2016, which is hereby incorporated by reference in its entirety.

BACKGROUND

Microelectronic elements often comprise a thin slab of a semiconductor material, such as silicon or gallium arsenide, commonly called a semiconductor chip or die. Dies are commonly provided as individual, prepackaged units. In some unit designs, the die is mounted to a substrate or a chip carrier, forming a microelectronic structure or package, for example, which may in turn be mounted on a circuit panel, such as a printed circuit board (PCB).

As integrated circuit (IC) chip technology matures, smaller packages are possible due to smaller and denser ICs. Many packages include solder masses in the form of solder balls that are typically between about 0.1 mm and about 0.8 mm (5 and 30 mils) in diameter, and are attached to the terminals of the package. A package having an array of solder balls projecting from its bottom surface (e.g., surface opposite the front face of the die) is commonly referred to as a ball grid array or "BGA" package. Other packages, referred to as land grid array or "LGA" packages are secured to the substrate by thin layers or lands formed from solder. Packages of this type can be quite compact. Certain packages, commonly referred to as "chip scale packages," occupy an area of the circuit board equal to, or only slightly larger than, the area of the device incorporated in the package. This scale is advantageous in that it reduces the overall size of the assembly and permits the use of short interconnections between various devices on the substrate, which in turn limits signal propagation time between devices and thus facilitates operation of the assembly at high speeds.

However, as carriers and packages (i.e., fan out wafer level packaging (FOWLP), coreless packages, etc.) become smaller, they are also becoming thinner, as well as the associated substrates, boards, redistribution layers (RDL), and so forth. Thus, substrate and package warpage is an increasing issue, which can create complications during package assembly, surface mount processing, and other manufacturing processes. For example, when substrate layers warp, the surfaces can become uneven and non-planar. This can have a negative impact on reliability and longevity of the packages and related assemblies.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure. Shapes and/or dimensions shown in the illustrations of the figures are for example, and other shapes and or dimensions may be used and remain within the scope of the disclosure, unless specified otherwise.

FIGS. 3A-3C show an example technique of reinforcing a carrier or a package, according to a further embodiment.

FIGS. 6A and 6B show a profile view and a bottom view, respectively, of a reinforced carrier or package assembly, according to an embodiment.

FIGS. 7A-7C show three examples of reinforced carriers or packages, according to various embodiments.

DETAILED DESCRIPTION

Overview

Figure 1A:
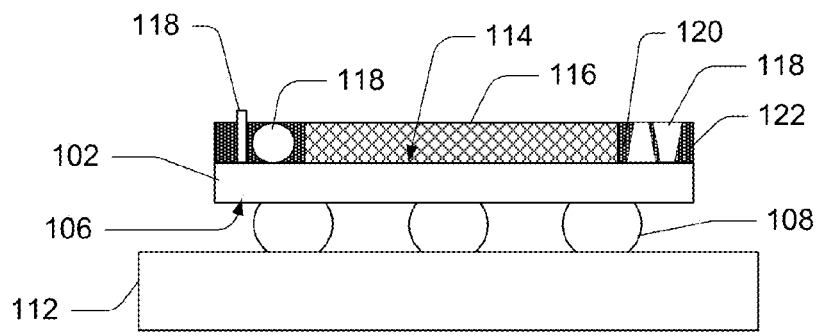
FIGS. 1A-1C show an example technique of reinforcing a carrier or a package, according to an embodiment.
Figure 1B:
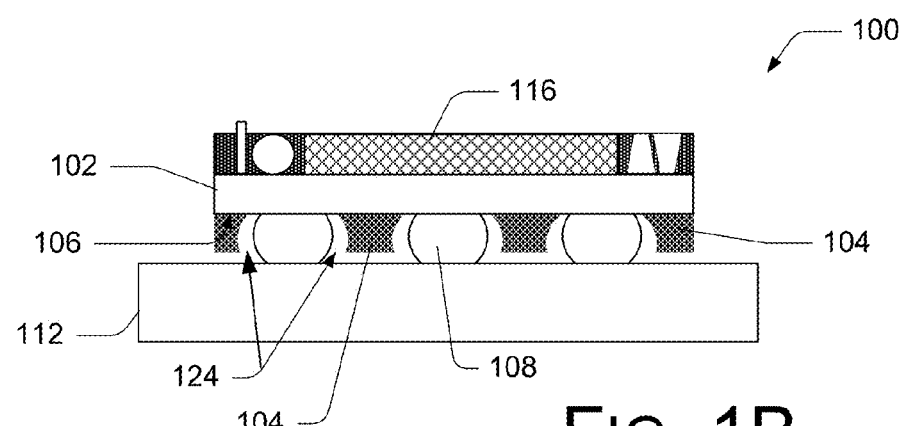
Figure 1C:
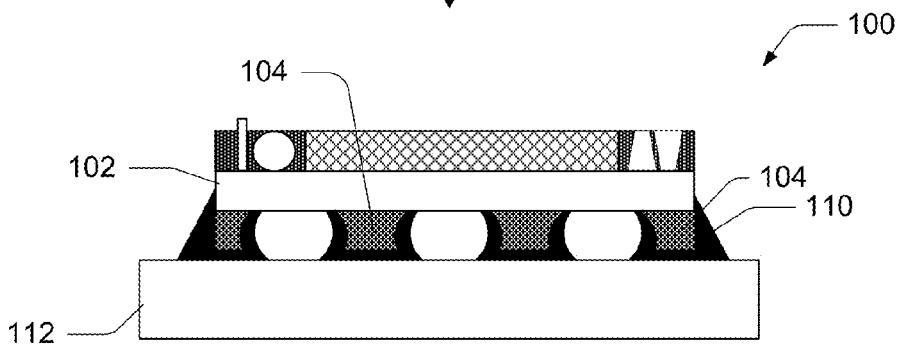

Representative implementations of devices and techniques provide reinforcement for a carrier or a package. A reinforcement layer is added to a surface of the carrier, often a bottom surface of the carrier that is generally under-utilized except for placement of terminal connections. The reinforcement layer adds structural support to the carrier or package, which can be very thin otherwise.

Various implementations provide a reinforcement layer that surrounds the solder balls (or other terminal connections) on a bottom surface of the carrier or package. In an implementation, the reinforcement layer does not fully surround the solder balls, but is arranged to form a space around at least a portion of each solder ball to allow for movement or a change in shape of the solder ball during further processing, such as heated reflow.

In various implementations, the space around the solder balls is formed using various techniques, including deforming the solder balls prior to forming the reinforcement layer. In another implementation, the reinforcement layer is formed first, and the solder balls are formed in pre-formed spaces in the reinforcement layer.

In an embodiment, the reinforcement layer has a coefficient of thermal expansion (CTE) that counters or offsets a CTE of the carrier or package, to assist in preventing or reducing warpage of the carrier or package. In one example, the CTE of the reinforcement layer (which is formed on a bottom surface of the carrier or package) offsets or counters a combined CTE of the carrier or package and many or all of the components coupled to a top surface of the carrier or package.

Various techniques and implementations of microelectronic assemblies are discussed in this disclosure, having various carriers, substrates, packages, and the like. Techniques and devices are discussed with reference to example IC chips and systems illustrated in the figures. However, the techniques and devices discussed may be applied to any of various microelectronic designs, circuits, packages, and devices and remain within the scope of the disclosure.

Advantages of the disclosed techniques and devices are varied, and include: 1) a reduction in the warping of carriers and packages; 2) more accuracy in processes such as surface mount techniques; 3) less potential for failed processes; and 4) more reliability of end product assemblies and components. Other advantages may be present, some of them being recognized by a person having skill in the art.

Implementations are explained in more detail below using a plurality of examples. Although various implementations and examples are discussed here and below, further implementations and examples may be possible by combining the features and elements of individual implementations and examples.

Example Microelectronic Structure

In various implementations, as shown in FIGS. 1A-7C, a microelectronic structure 100 is formed by adding a reinforcement layer 104 to a carrier or package, or to a layer of a carrier or package (hereinafter referred to as a "substrate 102," and includes carriers, packages, substrates, wafers, boards, redistribution layers, interposers, etc.) to add structural support to the substrate 102. With the addition of the reinforcement layer 104, the substrate 102 behaves like a thicker substrate 102, and warping of the substrate 102 is reduced or eliminated.

The illustrations of FIGS. 1A-7C are not intended to be limiting. In various implementations, a microelectronic structure 100 may include a different arrangement with alternate or additional components, and remain within the scope of the disclosure. It is to be understood that a microelectronic structure 100 (including like arrangements) may be implemented as a stand-alone circuit, apparatus, or device, or as part of another system (e.g., integrated with other components, packages, etc.).

In various embodiments, as illustrated in FIGS. 1A-7C for example, the reinforcement layer 104 is an added layer of material that is formed on a surface of the substrate 102 or bonded to the substrate 102. FIG. 1A shows an assembly prior to adding the reinforcement layer 104 and FIGS. 1B and 1C show two examples of the assembly with the reinforcement layer 104 added. In an embodiment, the reinforcement layer 104 is added to the second surface 106 (i.e., "underside") of the substrate 102, where solder balls 108 (such as a ball grid array (BGA), for example) or other terminal connections are typically located, which can be an otherwise unused portion of the substrate 102. In the embodiment, the reinforcement layer 104 adds structural support to the substrate 102, which may be very thin otherwise.

In some embodiments, the reinforcement layer 104 may be arranged to substantially surround the solder balls 108 (i.e., terminal connections) while leaving spaces 124 just adjacent to the solder balls 108, so that the reinforcement layer 104 is not touching the entire perimeter of the solder balls 108. In one example, the reinforcement layer 104 only touches a small portion (e.g., about 20% or less of the perimeter surface) of one or more of the solder balls 108, or not at all. The spaces 124 next to the solder balls 108 give room for the solder balls 108 to change shape or to move position during subsequent process steps, such as heated reflow for example, which improves reliability. In various embodiments, the reinforcement layer 104 is deliberately formed in a way to create the spaces 124 in pre-arranged shapes, configurations, and/or sizes.

In an implementation, the reinforcement layer 104 is formed on the second surface 106 of the substrate 102 without the use of a solder resist mask or an adhesive layer. For example, the reinforcement layer 104 is attached directly to the second surface 106 of the substrate 102, and can act as a solder resist mask during processing, when solder is added to the second surface 106 of the substrate 102 after applying the reinforcement layer 104. Optionally, an underfill material 110 may be added around the reinforcement layer 104 and solder balls 108 to enclose the underside of the assembly 100 when it is mounted to a second carrier or second package 112.

In various embodiments, the reinforcement layer 104 is comprised of a dielectric material, such as a molding compound, an encapsulant, a fill, or the like. For instance, the reinforcement layer 104 may comprise a b-stage dielectric cured on the second surface 106 of the substrate 102. In other embodiments, the reinforcement layer 104 is comprised of other materials as desired for structural reinforcement of the substrate 102. Further, the reinforcement layer 104 may be comprised of multiple layers as desired.

In an implementation, the reinforcement layer 104 material is selected to have a coefficient of thermal expansion (CTE) that counter balances a tendency of the substrate 102 to warp when heated. For instance, the CTE of the reinforcement layer 104 can be selected to be low (e.g., less than a CTE of a material of the substrate 102), to balance the higher CTE of the substrate 102, along with various components that are mounted to the first surface 114 ("topside surface") of the substrate 102. In an example, the coefficient of thermal expansion (CTE) of the reinforcement layer 104 is within 20% of an effective CTE of the components attached to the first surface 114 of the substrate 102, including a chip die 116, a plurality of interconnects 118, an underfill material 120, and a package encapsulant 122. In an embodiment, the coefficient of thermal expansion (CTE) of the reinforcement layer 104 is less than 12. In alternate embodiments, the CTE is greater or less than 12.

As shown in FIGS. 1A-3C, a microelectronic assembly 100 with a reinforcement layer 104 can be formed using varied techniques. In various embodiments, the reinforcement layer 104 may be added during different stages of manufacturing. For example, in one embodiment, the reinforcement layer 104 is formed on the second surface 106 of the substrate 102 before a die 116 or a package is coupled to the first surface 114 of the substrate 102. In another embodiment, as shown in FIGS. 1A-1C, the reinforcement layer 104 is formed on the second surface 106 of the substrate 102 after a die 116 or a package is coupled to the first surface 114 of the substrate 102, such as at the end of an assembly process, or the like. Optionally, as shown in FIG. 1C, an encapsulant or underfill material 110 may be added around the reinforcement layer 104 and solder balls 108 to enclose the underside of the assembly 100.

Figures 2A, 2B:
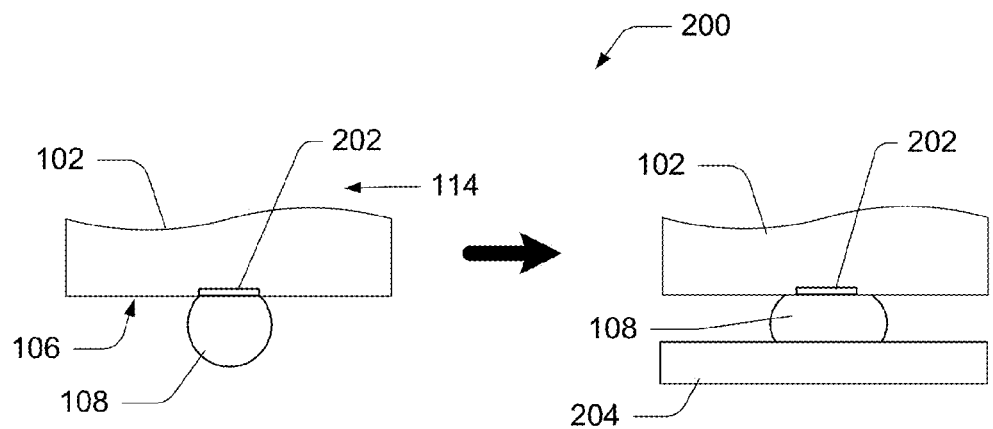
FIGS. 2A-2D show an example technique of reinforcing a carrier or a package, according to another embodiment.

In an implementation, as shown in FIGS. 2A-2D, a substrate 102 has a first surface 114 arranged to receive a microelectronic component 116 and a second surface 106 opposite the first surface 114. A process 200 for forming a microelectronic assembly 100 includes forming a plurality of electrical contacts 202 on the second surface 106 of the substrate 102. As shown at FIG. 2A, the process 200 includes forming a plurality of solder balls 108 on the plurality of electrical contacts 202.

As shown at FIG. 2B, the process includes deforming each solder ball 108 of the plurality of solder balls 108. In various implementations, the solder balls 108 may be deformed using different techniques. In one example, a tool 204 presses the solder balls 108 to change the shape of the solder balls 108 to an ovoid shape, for instance. In another example, a portion of each solder ball 108 is removed, by grinding or shaving, for instance, to change the shape of the solder balls 108 (resulting in a shorter, oblong shape, as desired).

Figures 2C, 2D:
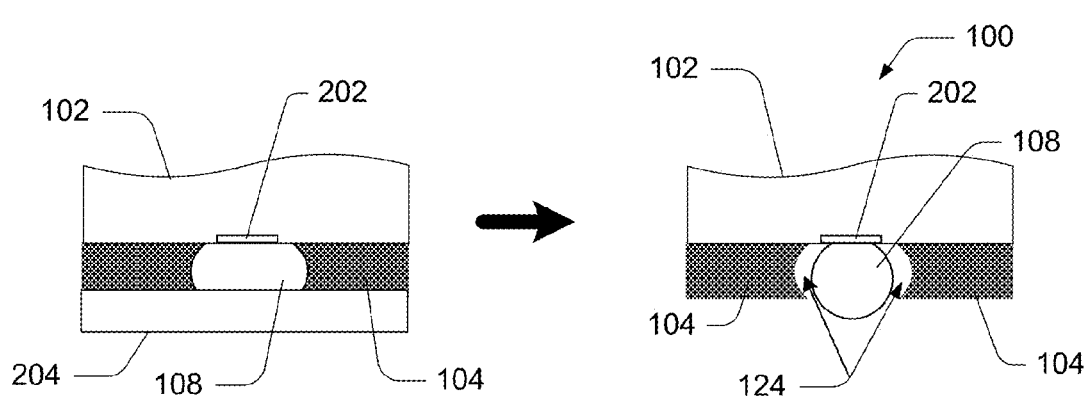

As shown at FIG. 2C, the process 200 includes forming a reinforcement layer 104 on the second surface 106 of the substrate 102 to add structural support to the substrate 102. In an example, the reinforcement layer 104 surrounds each deformed solder ball 108, substantially contacting the surface of each solder ball 108. The reinforcement layer 104 is formed directly on the second surface 106 of the substrate 102, without a solder mask, adhesive, or any other intervening layer. The reinforcement layer 104 may be formed with the tool 204 still in place, however.

As shown at FIG. 2D, the process 200 includes reflowing the plurality of solder balls 108 to partially or completely detach each solder ball 108 from the reinforcement layer 104. Reflowing the solder balls 108 creates an opening or space 124 around each solder ball 108 that has a generally truncated ovoid shape, when the solder balls 108 had an ovoid shape before the reflow. However, the solder balls 108 are more spherical after the reflow (due to surface tension of the solder).

Thus, the process 200 includes reducing a mechanical stress between the solder balls 108 and the reinforcement layer 104 (and improving reliability) by at least partially decoupling the solder balls 108 from the reinforcement layer 104. In the implementation, the decoupling allows the solder balls 108 to expand or to change a position during later processing, such as heated reflow to couple the assembly 100 to a second carrier or second package 112.

In another embodiment, as shown in FIGS. 3A-3C, a process 300 for forming a microelectronic assembly 100 includes forming a plurality of electrical contacts 202 on the second surface 106 of a substrate 102, where the substrate 102 has a first surface 114 arranged to receive a microelectronic component 116 and a second surface 106 opposite the first surface 114. The process 300 includes forming a reinforcement layer 104 on the second surface 106 of the substrate 102 to add structural support to the substrate 102, as shown at FIG. 3A, prior to forming solder balls 108.

In an embodiment, the reinforcement layer 104 includes one or more openings 302 to reveal the electrical contacts 202. For example, the reinforcement layer 104 may be deliberately formed to include several openings 302, to form contact terminals (e.g., solder balls 108) within. In one example (not shown), the one or more openings 302 in the reinforcement layer 104 are formed prior to attaching the reinforcement layer 104 to the second surface 106 of the substrate 102. In another example, the one or more openings 302 are formed in the reinforcement layer 104 during or after attaching (or forming) the reinforcement layer 104 to the second surface 106 of the substrate 102.

The process 300 includes forming a plurality of solder balls 108 on the plurality of electrical contacts 202 and within the one or more openings 302. The solder balls 108 make partial contact or no contact with the reinforcement layer 104 and have space 124 with respect to the reinforcement layer 104 to change position and change shape when used to electrically couple the substrate 102 to a second carrier 112 or a second package.

In one embodiment, as shown at FIG. 3B, the process 300 includes filling the one or more openings 302 with solder (or the like), and reflowing to form the plurality of solder balls 108 and to partially or completely decouple the solder balls 108 from the reinforcement layer 104 (as shown at FIG. 3C). In another embodiment, the solder balls 108 are deposited as solder balls 108 within the openings 302 and coupled to the electrical contacts 202, as shown at FIG. 3C. In the embodiment, the solder balls 108 are deposited so as to make space 124 between the solder balls 108 and the reinforcement layer 104.

In various implementations, the processes 200 or 300 include printing solder onto the plurality of electrical contacts 202 and reflowing the printed solder to form the plurality of solder balls 108. In other implementations, the solder balls 108 are formed using different techniques. A microelectronic assembly 100 may be formed using the processes 200 or 300, or other processes as desired to achieve the desired structure 100.

Figure 4A:
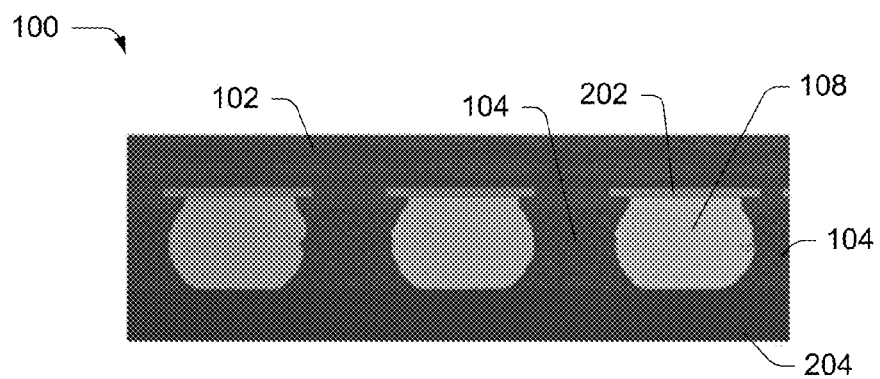
FIGS. 4A-4C show images of example carrier or package reinforcement techniques, according to various embodiments.
Figure 4B:
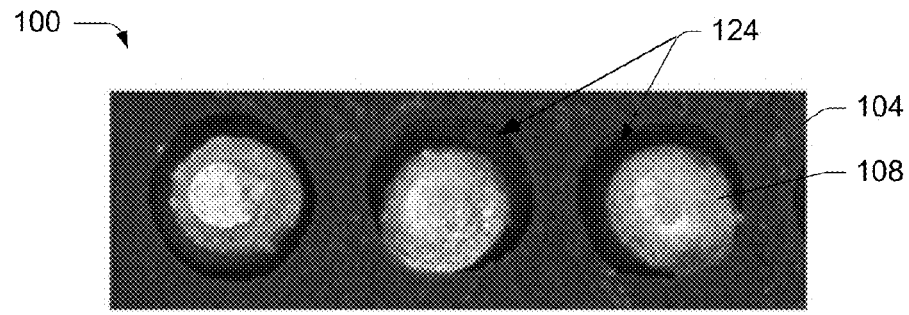
Figure 4C:
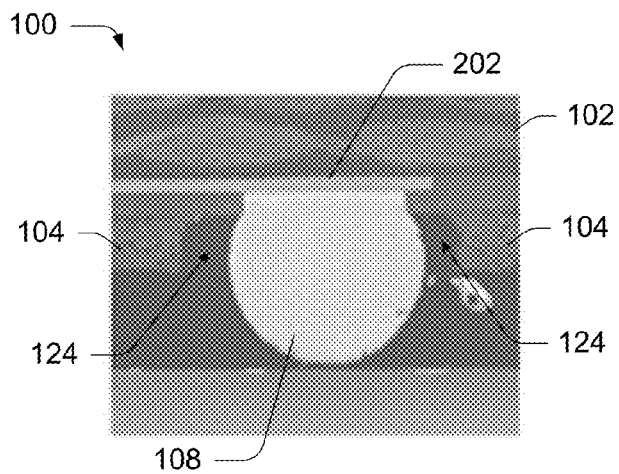

FIGS. 4A-4C show images of the solder balls 108 and the reinforcement layer 104 of the assembly 100. The image at FIG. 4A shows a profile view of the reinforcement layer 104 formed around the deformed solder balls 108, before reflow of the solder balls 108. The tool 204 is still in place on the solder balls 108. The image at FIG. 4B shows a bottom view after reflow, with the solder balls 108 partially or fully decoupled from the reinforcement layer 104. The spaces 124 (or openings 302) provide room for the solder balls 108 to change shape or to move during later processes. The image at FIG. 4C shows a profile view of part of an example assembly 100, where the solder ball 108 is reformed after reflow. As shown in FIG. 4C, the solder ball 108 is bordered by the adjacent spaces 124 (or within the formed opening 302) formed by the reinforcement layer 104. In an embodiment, as shown, the spaces 124 can form a truncated ovoid shape based on the formation technique described above.

Figure 5A:
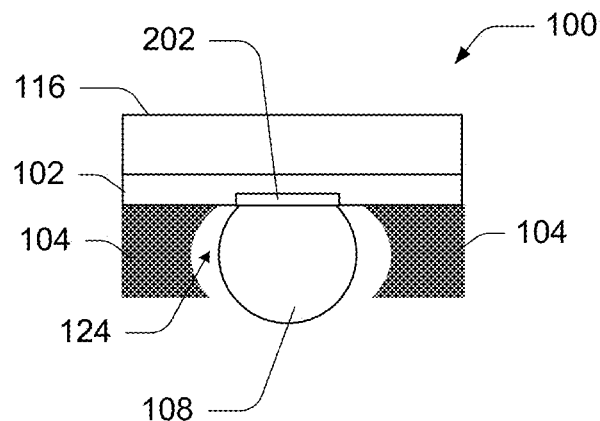
FIGS. 5A and 5B show two examples of reinforced carriers or packages, according to various embodiments.
Figure 5B:
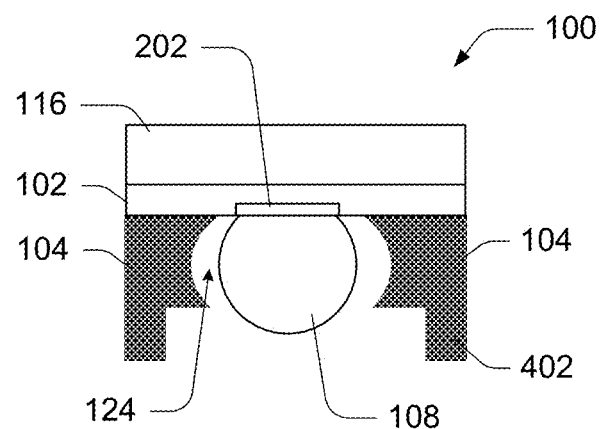

FIGS. 5A and 5B show two examples of reinforced substrates 102, according to various embodiments. The two profile views of example assemblies 100 show a solder ball 108 after reflow, and within the truncated ovoid shaped spaces 124 formed by the reinforcement layer 104. A single solder ball 108 is within each of the one or more spaces 124 and an inner surface of the one or more spaces 124 comprises a truncated ovoid shape. The solder balls 108 are partially or fully decoupled from the reinforcement layer 104, based on the shape of the spaces 124 (or openings 302) in the reinforcement layer 104.

In an implementation, as shown in FIGS. 4C, 5A and 5B, the reinforcement layer 104 has a thickness that is at least 50% of a height of the solder balls 108. In other implementations, the reinforcement layer 104 has a thickness based on the thickness of the substrate 102, for example.

In an embodiment, as shown in FIGS. 6A and 6B, multiple solder balls 108 may be arranged within an opening 302 in the reinforcement layer 104. For example, the microelectronic assembly 100 shown in FIGS. 6A and 6B includes one or more groups of solder balls 108 within each of the one or more openings 302. In various implementations, the openings 302 are formed prior to attaching the reinforcement layer 104 to the second surface 106 of the substrate 102 or are formed during or after attaching the reinforcement layer 104 to the second surface 106 of the substrate 102. As with some other embodiments, the plurality of solder balls 108 shown in FIGS. 6A and 6B comprises a ball grid array (BGA) at the second surface 106 of the substrate 102.

Additional Implementations

FIGS. 7A-7C show three examples of microelectronic assemblies 100 with a reinforced substrate 102 having a reinforcement layer 104, according to various embodiments. As shown in FIG. 7A, the assembly 100 may include a top substrate 702, which may comprise a memory device, interposer, carrier, or the like. Additionally, the assembly 100 may include a full or partial capillary underfill (CUF) 704, partially or fully encapsulating the die 116 (which may be molded or encased). This may be in addition to one or more of various interconnection components 118 mounted to the top surface 114 of the substrate 102, which may comprise solder balls, conductive pillars, or combinations (or stacks) of one or more solder balls and one or more conductive pillars.

As shown in FIG. 7B, the assembly 100 may also include a molded underfill (MUF) 706 encapsulating a die 116, which may be without a die encasing and may be coupled to the substrate 102 with terminal connections 708 (solder balls, wire bond, etc.). Further, as shown in FIG. 7C, the assembly 100 may not include the top substrate 702, but may still include a partial or full encapsulant 710 over the die 116, which may cover one or more interconnection components 118 mounted to the top surface 114 of the substrate 102.

In the various embodiments illustrated in FIGS. 7A-7C (and other like embodiments) the reinforcement layer 104 may be arranged to have a CTE to counter or offset the "topside" components (die 116, interconnection components 118 and 708, CUF 704, MUF 706, encapsulant 710, top substrate 702, etc.), or a subset of the "topside" components, to prevent warpage. In other words, the reinforcement layer 104 provides structural support to the substrate 102 to prevent warpage, and may also provide a counter-balanced CTE, based on a CTE of the substrate 102 and CTEs of one or more components mounted to the top surface 114 of the substrate 102, to further prevent warpage of the substrate 102 and/or the assembly 100.

Figure 8A:
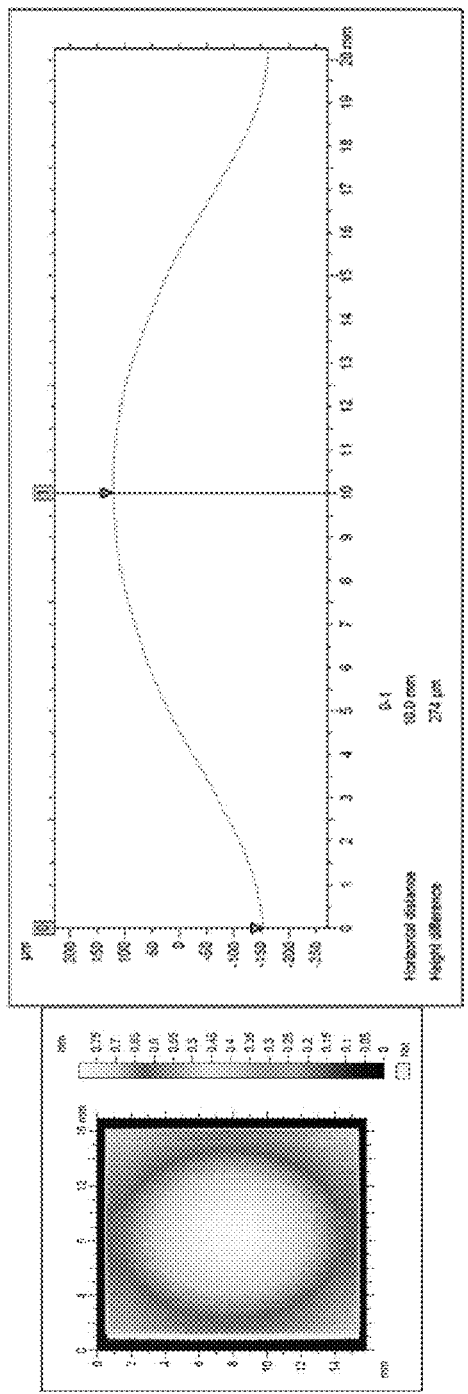
FIGS. 8A-9B show images and diagrams with example results of carrier reinforcement techniques, according to various embodiments.
Figure 8B:
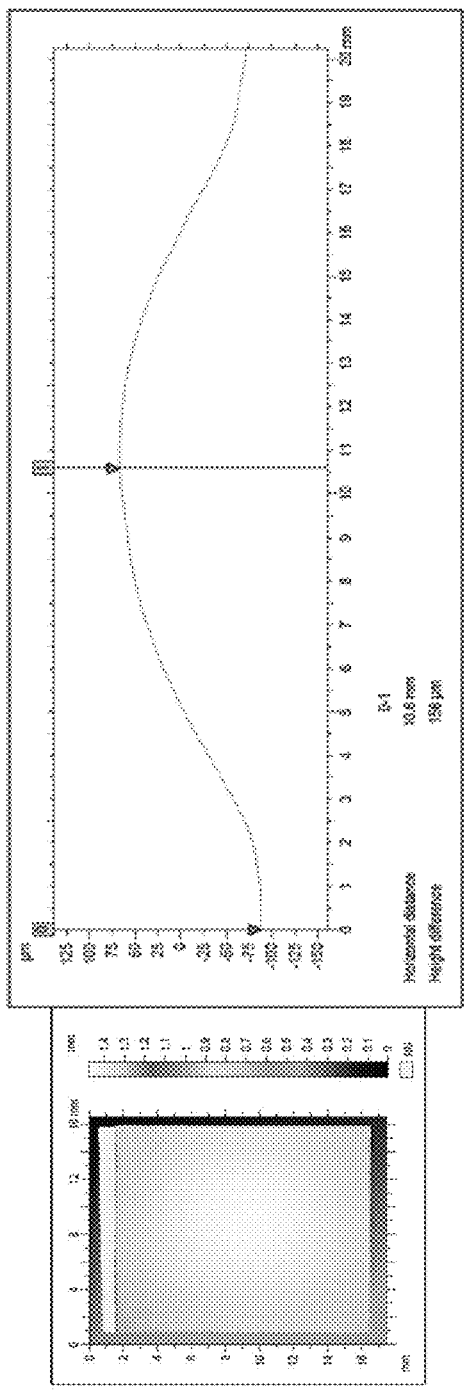
Figure 9A:
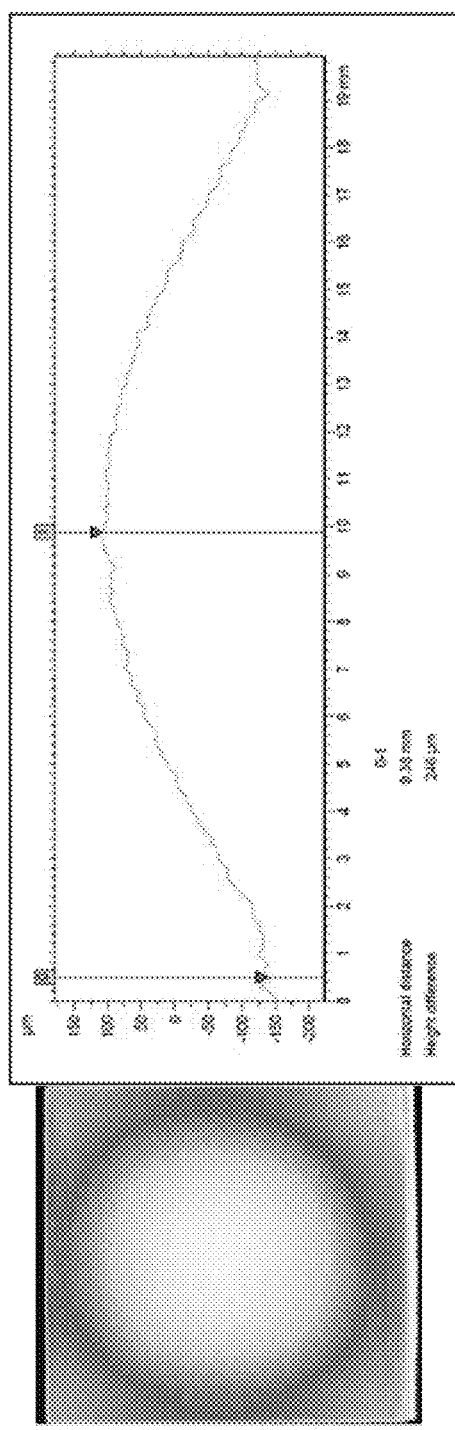
Figure 9B:
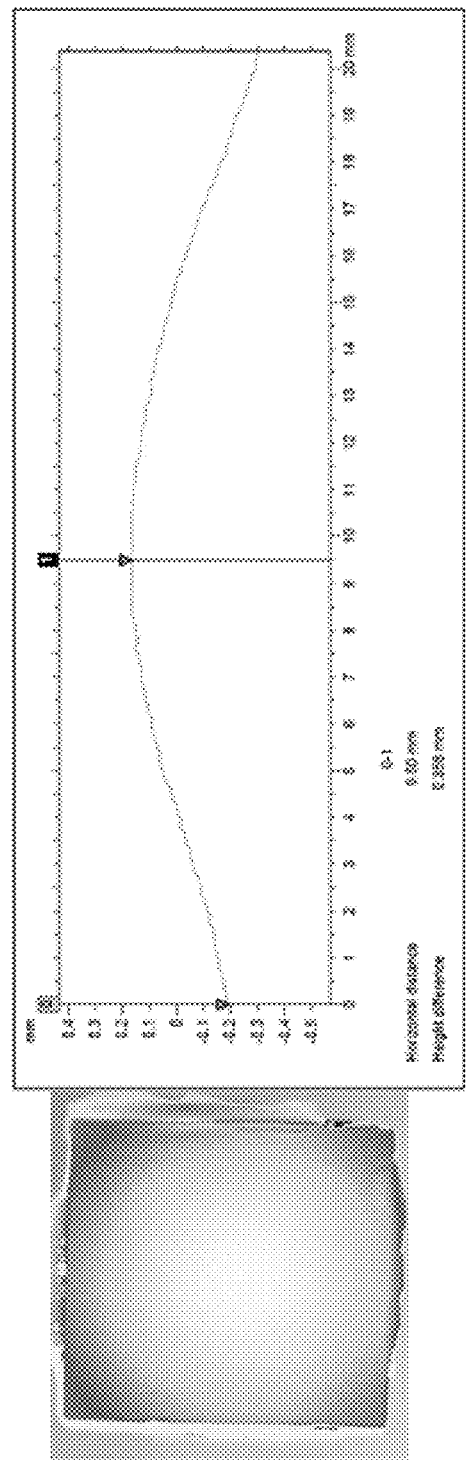

FIGS. 8A-9B show the results of varying CTEs of reinforcement layers 104 in assemblies 100. FIG. 8A shows an assembly 100 without a reinforcement layer 104. FIG. 8B illustrates an example of using a reinforcement layer 104 having a lower CTE than the substrate 102. The result shown when comparing FIGS. 8A and 8B indicates a reduction in the warping of the substrate 102 on the assembly 100 with the reinforcement layer 104. FIG. 9A shows an assembly 100 without a reinforcement layer 104. FIG. 9B illustrates an example of using an underfill having a higher CTE than the substrate 102. The result shown when comparing FIGS. 9A and 9B indicates an increase in the warping of the substrate 102 with the higher CTE underfill. Generally, a solder resist mask or an adhesive layer also has a higher CTE than the substrate 102, and therefore, when used against the substrate 102, the solder resist mask or an adhesive layer can increase warpage of the substrate 102 rather than reduce it.

Various implementations of devices and techniques for reinforced carriers and packages are discussed in this disclosure. The devices and techniques are discussed with reference to example implementations illustrated in the figures. The devices and techniques discussed herein are referred to in the context of a packaged integrated circuit (IC) chip, for ease of discussion and illustrative convenience. The devices and/or techniques may also be used in other environments, with other implementations, and associated with other components, systems, processes, and the like, to provide improved reliability of thinner carriers and packages.

Implementations are explained in detail using a plurality of examples. Although various implementations and examples are discussed herein, further implementations and examples may be possible by combining the features and elements of individual implementations and examples. Processes disclosed (such as processes 200 and 300) result in novel structures and assemblies, such as a microelectronic assembly 100.

Representative Processes

Figure 10:
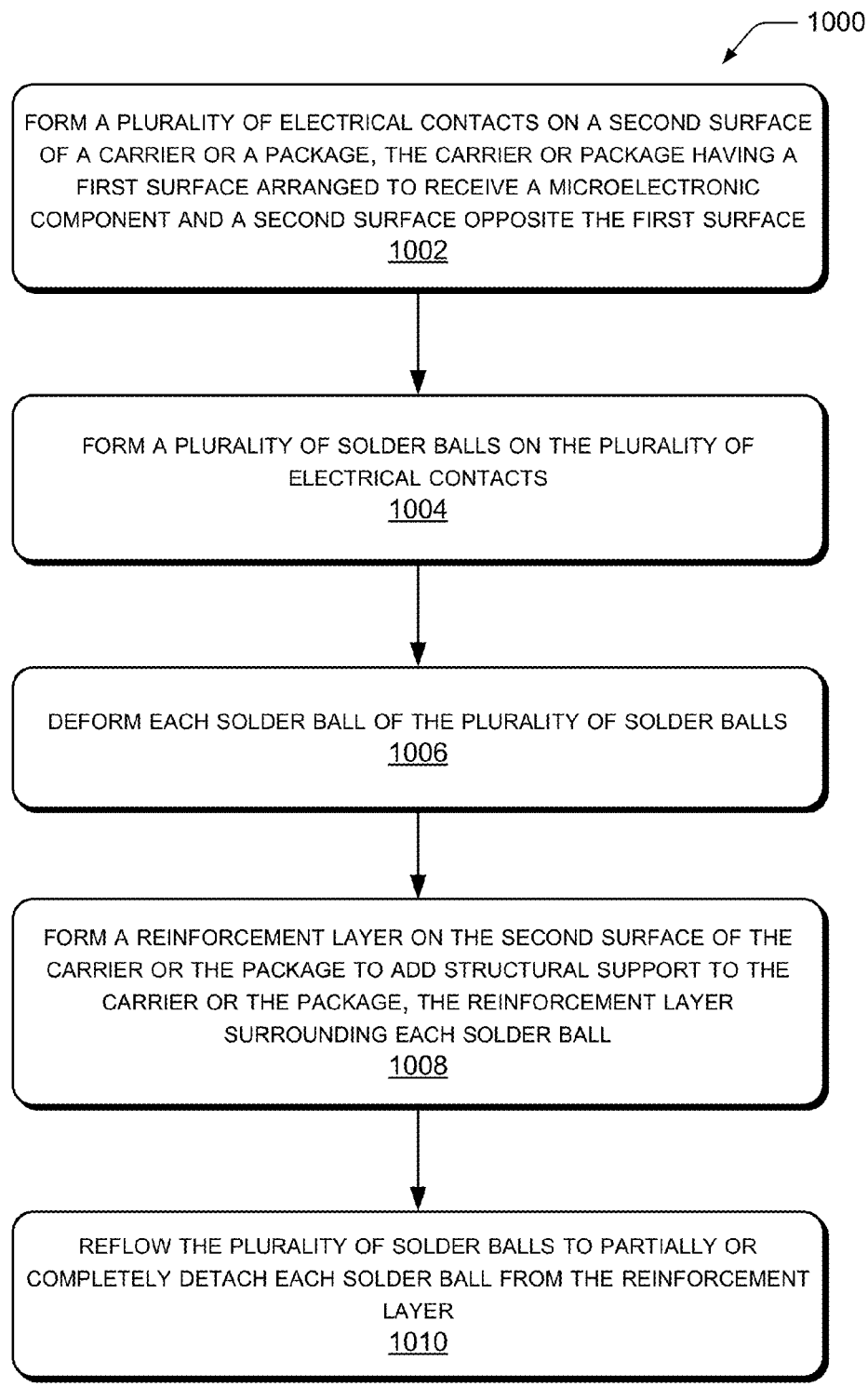
FIGS. 10 and 11 are flow diagrams illustrating example processes of reinforcing a carrier or package, according to various implementations.
Figure 11:
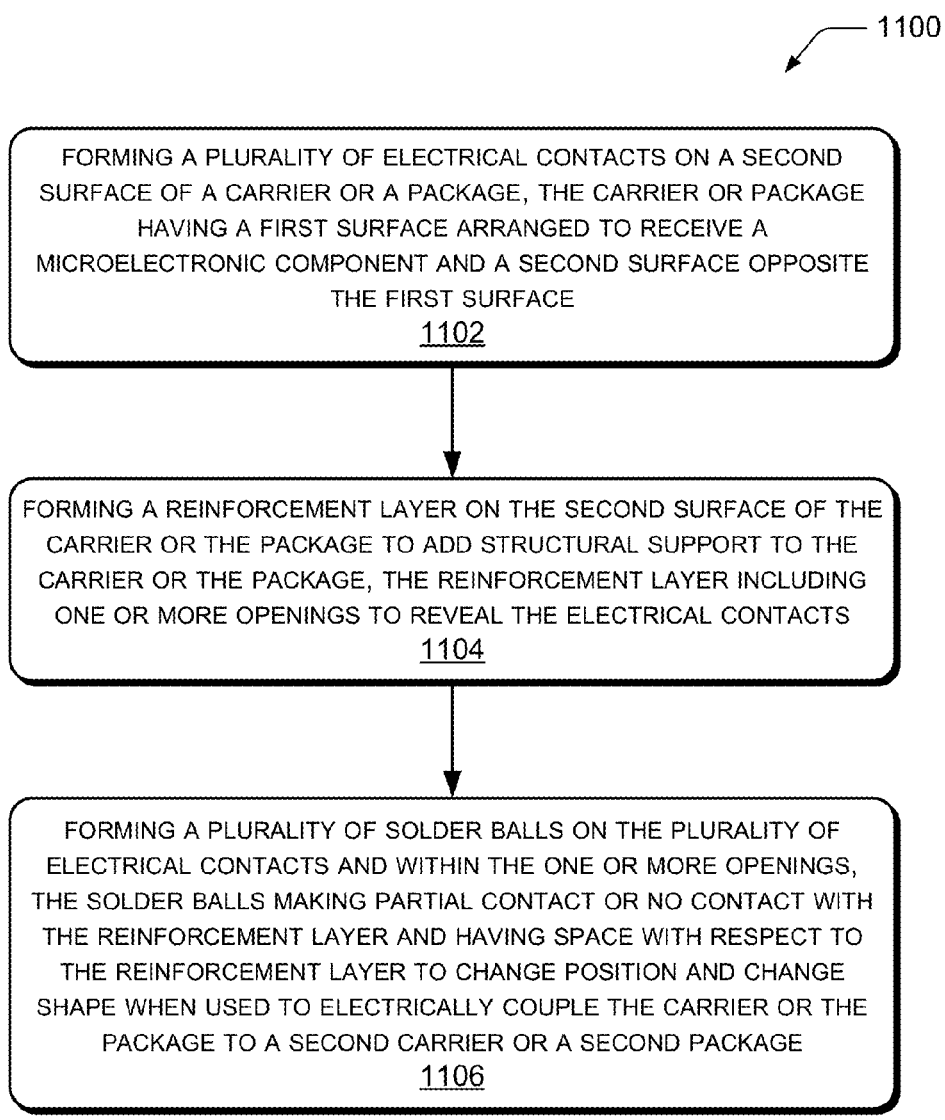

FIGS. 10 and 11 illustrate representative processes 1000 and 1100, respectively, for providing a reinforcement layer (such as reinforcement layer 104, for example) to a substrate (such as substrate 102, for example), to reduce warpage of the substrate, according to various implementations. The example processes 1000 and 1100 are described with reference to FIGS. 1A-9B. The example process 1000 can correspond to the process 200 and like processes, and the example process 1100 can correspond to the process 300 and like processes.

The order in which the processes are described is not intended to be construed as a limitation, and any number of the described process blocks can be combined in any order to implement the processes, or alternate processes. Additionally, individual blocks may be deleted from the processes without departing from the spirit and scope of the subject matter described herein. Furthermore, the processes can be implemented in any suitable hardware, software, firmware, or a combination thereof, without departing from the scope of the subject matter described herein.

Referring to FIG. 10, at block 1002, the process 1000 includes forming a plurality of electrical contacts (such as electrical contacts 202, for example) on a second surface of a carrier or a package (such as substrate 102, for example), the carrier or package having a first surface (such as first surface 114, for example) arranged to receive a microelectronic component (such as die 116, for example), and a second surface (such as second surface 106, for example) opposite the first surface.

At block 1004, the process 1000 includes forming a plurality of solder balls (such as solder balls 108, for example) on the plurality of electrical contacts. In alternate embodiments, other terminal connection components (conductive pillars, interconnect structures, etc.) may be used in place of the solder balls. In an implementation, the process 1000 includes printing solder onto the plurality of electrical contacts and reflowing the printed solder to form the plurality of solder balls.

At block 1006, the process 1000 includes deforming each solder ball of the plurality of solder balls. For example, the solder balls may be deformed by pressing on the solder balls with a tool (such as tool 204, for example) to deform them (to change a shape of the solder balls), the solder balls may be shaped by removing a portion of each solder ball by grinding, shaving, (or the like) the solder balls, or other techniques may be used to deform the solder balls.

At block 1008, the process 1000 includes forming a reinforcement layer (such as reinforcement layer 104, for example) on the second surface of the carrier or the package to add structural support to the carrier or the package. In an embodiment, the reinforcement layer substantially surrounds each solder ball.

In an implementation, the process 1000 includes forming the reinforcement layer on the second surface of the carrier or the package without the use of a solder resist mask or an adhesive layer. In another implementation, the process 1000 includes selecting a reinforcement layer material having a coefficient of thermal expansion (CTE) that counter balances a warpage tendency of the carrier or the package. For example, the process may include selecting a reinforcement layer material having a CTE that counter balances a CTE of the carrier or the package, and that may include a combined CTE of components mounted to the carrier or the package.

In an example, the CTE of the reinforcement layer material is less than the CTE of a material of the carrier or the package.

At block 1010, the process 1000 includes reflowing the plurality of solder balls to partially or completely detach each solder ball from the reinforcement layer. In an implementation, the process 1000 includes forming an opening or space in the reinforcement layer around each solder ball, the opening having a truncated ovoid shape. In an embodiment, detaching the solder balls from the reinforcement layer forms one or more spaces (such as spaces 214 or openings 302, for example).

In an implementation, the process 1000 includes reducing a mechanical stress between the solder balls and the reinforcement layer by at least partially decoupling the solder balls from the reinforcement layer, the decoupling allowing the solder balls to expand or change a position during later processing.

Referring to FIG. 11, at block 1102, the process 1100 includes forming a plurality of electrical contacts (such as electrical contacts 202, for example) on a second surface of a carrier or a package (such as substrate 102, for example), the carrier or package having a first surface (such as first surface 114, for example) arranged to receive a microelectronic component and a second surface (such as second surface 106, for example) opposite the first surface.

At block 1104, the process 1100 includes forming a reinforcement layer (such as reinforcement layer 104, for example) on the second surface of the carrier or the package to add structural support to the carrier or the package, the reinforcement layer including one or more openings (such as openings 302, for example) to reveal the electrical contacts.

In an implementation, the process 1100 includes forming the reinforcement layer on the second surface of the carrier or the package without the use of a solder resist mask or an adhesive layer. In another implementation, the process 1100 includes forming the one or more openings in the reinforcement layer prior to attaching the reinforcement layer to the second surface of the carrier or the package. For example, the process 1100 can include forming the one or more openings in the reinforcement layer after attaching the reinforcement layer to the second surface of the carrier or the package.

In an implementation, the process 1100 includes forming the reinforcement layer on the second surface of the carrier or the package before a die or a package is coupled to the first surface of the carrier or the package. In another implementation, the process 1100 includes forming the reinforcement layer on the second surface of the carrier or the package after a die or a package is coupled to the first surface of the carrier or the package.

At block 1106, the process 1100 includes forming a plurality of solder balls (such as solder balls 108, for example) on the plurality of electrical contacts and within the one or more openings, the solder balls making partial contact or no contact with the reinforcement layer and having space (such as such as spaces 124, for example) with respect to the reinforcement layer to change position and change shape when used to electrically couple the carrier or the package to a second carrier or a second package.

In an implementation, the process 1100 includes filling the one or more openings with solder, and reflowing to form the plurality of solder balls and to partially or completely decouple the solder balls from the reinforcement layer.

In an implementation, the process 1100 includes forming the reinforcement layer using a material having a coefficient of thermal expansion (CTE) less than 12.

In alternate implementations, other techniques may be included in the processes 1000 and/or 1100 in various combinations, and remain within the scope of the disclosure.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:

1. A method of fabricating a microelectronic assembly, comprising:
   forming a plurality of electrical contacts on a second surface of a carrier or a package, the carrier or package having a first surface arranged to receive a microelectronic component and a second surface opposite the first surface;
   forming a plurality of solder balls on the plurality of electrical contacts;
   deforming each solder ball of the plurality of solder balls;
   forming a reinforcement layer on the second surface of the carrier or the package to add structural support to the carrier or the package, the reinforcement layer surrounding each solder ball;
   reflowing the plurality of solder balls to partially or completely detach each solder ball from the reinforcement layer.

2. The method of claim 1, further comprising pressing on the solder balls with a tool to change a shape of the solder balls prior to forming the reinforcement layer.

3. The method of claim 1, further comprising removing a portion of each solder ball by grinding or shaving to deform the solder balls.

4. The method of claim 1, further comprising forming an opening in the reinforcement layer around each solder ball, the opening having a truncated ovoid shape.

5. The method of claim 1, further comprising forming the reinforcement layer on the second surface of the carrier or the package without the use of a solder resist mask or an adhesive layer.

6. The method of claim 1, further comprising reducing a mechanical stress between the solder balls and the reinforcement layer by at least partially decoupling the solder balls from the reinforcement layer, the decoupling allowing the solder balls to expand or change a position during later processing.

7. The method of claim 1, further comprising selecting a reinforcement layer material having a coefficient of thermal expansion (CTE) that counter balances a warpage tendency of the carrier or the package.

8. The method of claim 7, wherein the CTE of the reinforcement layer material is less than a CTE of a material of the carrier or the package.

9. A method of fabricating a microelectronic assembly, comprising:
   forming a plurality of electrical contacts on a second surface of a carrier or a package, the carrier or package having a first surface arranged to receive a microelectronic component and a second surface opposite the first surface;

forming a reinforcement layer on the second surface of the carrier or the package to add structural support to the carrier or the package, the reinforcement layer including one or more openings to reveal the electrical contacts; and forming a plurality of solder balls on the plurality of electrical contacts and within the one or more openings, the solder balls making partial contact or no contact with the reinforcement layer and having space with respect to the reinforcement layer to change position and change shape when used to electrically couple the carrier or the package to a second carrier or a second package.

10. The method of claim 9, further comprising forming the reinforcement layer on the second surface of the carrier or the package without the use of a solder resist mask or an adhesive layer.

11. The method of claim 9, further comprising forming the reinforcement layer using a material having a coefficient of thermal expansion (CTE) less than 12.

12. The method of claim 9, further comprising forming the one or more openings in the reinforcement layer prior to attaching the reinforcement layer to the second surface of the carrier or the package.

13. The method of claim 9, further comprising forming the one or more openings in the reinforcement layer after attaching the reinforcement layer to the second surface of the carrier or the package.

14. The method of claim 9, further comprising filling the one or more openings with solder, and reflowing to form the plurality of solder balls and to partially or completely decouple the solder balls from the reinforcement layer.

15. The method of claim 9, further comprising forming the reinforcement layer on the second surface of the carrier or the package after a die or a package is coupled to the first surface of the carrier or the package.

16. A microelectronic structure, comprising:
a carrier or a package having a first surface and a second surface opposite the first surface;
a plurality of electrical contacts disposed on the second surface of the carrier or the package;
a reinforcement layer disposed on the second surface of the carrier or the package, the reinforcement layer including one or more openings to reveal the electrical contacts, the reinforcement layer arranged to add structural support to the carrier or the package; and
a plurality of solder balls disposed within the one or more openings and coupled to the electrical contacts, the solder balls making partial contact or no contact with the reinforcement layer and having space with respect to the reinforcement layer to change position and change shape when used to electrically couple the carrier or the package to a second carrier or a second package.

17. The microelectronic structure of claim 16, further comprising one or more groups of solder balls within each of the one or more openings.

18. The microelectronic structure of claim 16, wherein the reinforcement layer is attached directly to the second surface of the carrier or the package without the use of a solder resist mask or an adhesive.

19. The microelectronic structure of claim 16, wherein a coefficient of thermal expansion (CTE) of the reinforcement layer is within 20% of an effective CTE of components attached to the first surface of the carrier, including a chip die, a plurality of interconnects, an underfill material, and a package encapsulant.

20. The microelectronic structure of claim 16, wherein the one or more openings in the reinforcement layer are drilled prior to attaching the reinforcement layer to the second surface of the carrier or the package.

* * * * *